(12) United States Patent
Lu et al.

(10) Patent No.: US 12,214,446 B2
(45) Date of Patent: Feb. 4, 2025

(54) LASER LIFT-OFF INTEGRATED APPARATUS

(71) Applicant: SINO NITRIDE SEMICONDUCTOR CO., LTD., Guangdong (CN)

(72) Inventors: Jingquan Lu, Guangdong (CN); Junjie Ren, Guangdong (CN); Wenrong Zhuang, Guangdong (CN); Ming Sun, Guangdong (CN)

(73) Assignee: SINO NITRIDE SEMICONDUCTOR CO., LTD. (CN)

( * ) Notice: Subject to any disclaimer, the term of this patent is extended or adjusted under 35 U.S.C. 154(b) by 388 days.

(21) Appl. No.: 17/310,567

(22) PCT Filed: Jun. 1, 2020

(86) PCT No.: PCT/CN2020/093665
§ 371 (c)(1),
(2) Date: Aug. 11, 2021

(87) PCT Pub. No.: WO2021/036381
PCT Pub. Date: Mar. 4, 2021

(65) Prior Publication Data
US 2022/0176496 A1 Jun. 9, 2022

(30) Foreign Application Priority Data

Aug. 26, 2019 (CN) .......................... 201910788121.X

(51) Int. Cl.
*B23K 26/53* (2014.01)
*B23K 26/00* (2014.01)
*B23K 26/03* (2006.01)
*B23K 26/06* (2014.01)
(Continued)

(52) U.S. Cl.
CPC .............. *B23K 26/53* (2015.10); *B23K 26/00* (2013.01); *B23K 26/032* (2013.01);
(Continued)

(58) Field of Classification Search
CPC .............. B23K 2103/56; B23K 26/032; B23K 26/046; B23K 26/0665; B23K 26/082;
(Continued)

(56) References Cited

U.S. PATENT DOCUMENTS 6,080,965 A * 6/2000 Osawa .............. H01L 21/67115
219/390
2006/0011592 A1 1/2006 Wang et al.
(Continued)

FOREIGN PATENT DOCUMENTS

CN 105436710 A 3/2016
CN 109148369 A 1/2019
(Continued)

OTHER PUBLICATIONS

Extended European Search Report dated Oct. 10, 2023; European Patent Application No. 20857814.6.
(Continued)

*Primary Examiner* — Joe E Mills, Jr.
(74) *Attorney, Agent, or Firm* — McDonald Hopkins LLC

(57) ABSTRACT

A laser lift-off integrated apparatus includes a laser light source configured to perform laser lift-off on a wafer to undergo lift-off, a lift-off chamber configured to bear the wafer to undergo lift-off, a heater configured to provide temperature required by the wafer to undergo lift-off during a lift-off process, a profile measuring device configured to acquire surface profile information of the wafer to undergo lift-off, and a movable device configured to, according to the surface profile information acquired by the profile measuring device, adjust a height of the wafer to undergo lift-off such that a focus of the laser light source is at a position where the wafer to undergo lift-off is to undergo lift-off.

9 Claims, 3 Drawing Sheets

(51) Int. Cl.
  *B23K 26/08* (2014.01)
  *B23K 26/082* (2014.01)
  *B23K 26/70* (2014.01)
  *B23K 103/00* (2006.01)

(52) U.S. Cl.
  CPC ........ *B23K 26/0665* (2013.01); *B23K 26/082* (2015.10); *B23K 26/702* (2015.10); *B23K 26/0823* (2013.01); *B23K 26/083* (2013.01); *B23K 2103/56* (2018.08)

(58) Field of Classification Search
  CPC .. B23K 26/0823; B23K 26/53; B23K 26/702; B23K 26/707; B23K 26/00; B23K 26/083; B23K 26/36; B23K 2101/40; H01L 21/02005; H01L 21/7813; H01L 22/12
  See application file for complete search history.

(56) References Cited

U.S. PATENT DOCUMENTS

2011/0039356 A1* 2/2011 Ando ................ B32B 38/10
  257/E21.53
2018/0304409 A1* 10/2018 Nakamura ............ H01L 21/78

FOREIGN PATENT DOCUMENTS

| CN | 110102877 A | 8/2019 |
| CN | 110534477 A | 12/2019 |
| JP | 2003211277 A | 7/2003 |
| JP | 2007109799 A | 4/2007 |
| JP | 2009152305 A | 7/2009 |
| JP | 2010014444 A | 1/2010 |
| JP | 2011040564 A | 2/2011 |
| JP | 2015166751 A | 9/2015 |

OTHER PUBLICATIONS

Office Action mailed Sep. 21, 2022; Japanese Patent Application No. 2021-551876.
International Search Report and Written Opinion received for PCT/CN2020/093665, mailed Aug. 31, 2020.
Search Report received for Chinese Application No. 201910788121.X dated May 21, 2021.
First Office Action received for Chinese Application No. 201910788121.X, dated May 27, 2021. (English Translation).

* cited by examiner

LASER LIFT-OFF INTEGRATED APPARATUS

CROSS-REFERENCE TO RELATED APPLICATIONS

This application is a U.S. National Stage Application of PCT Application Serial No. PCT/CN2020/093665, filed Jun. 1, 2020, which claims priority to Chinese Patent Application No. 201910788121.X filed Aug. 26, 2019, the disclosure of which is incorporated herein by reference in its entirety.

TECHNICAL FIELD

The present application relates to the technical field of semiconductor manufacturing apparatus and, in particular, to a laser lift-off integrated apparatus.

BACKGROUND

At the end of the twentieth century, in order for high-frequency, high-efficiency and high-power electronic power devices to be prepared, the development of the third-generation wide-bandgap semiconductor materials represented by Gallium Nitride (GaN) was promoted. Due to its excellent performance, GaN can be applied for preparation of high-power and high-frequency devices and other semiconductor devices that work under special conditions and thus has been widely studied and applied. The crystalline quality of a GaN epitaxial layer is a fundamental guarantee for implementation of high-performance GaN-based devices. Moreover, using a GaN single crystal substrate to implement the homoepitaxy is the main method to improve the crystal quality of the GaN epitaxial layer and the GaN-based devices.

In the related art, the preparation technology of a large-size free-standing GaN substrate has become one of the largest obstacles in its development. The preparation process is usually that a GaN film is grown hetero-epitaxially on a sapphire substrate and then the Laser Lift-off Technique is used to separate the GaN film from the sapphire, and thus the free-standing GaN substrate is obtained. During the process of GaN epitaxial growth, residual stresses are lattice mismatch stress and thermal mismatch stress. The lattice mismatch stress is mainly caused by the lattice constant mismatch between the sapphire substrate and the GaN crystal; the thermal mismatch stress mainly arrives from their different thermal expansion coefficients. A GaN epitaxial wafer is grown at a high temperature above 800 degrees centigrade. After the growth is completed and cooling down, the ratio of the lattice shrinkage of the two is quite different, so the lattices of the two are mutually constrained, resulting in large warpage of GaN and sapphire composite substrate.

Due to the large warpage of GaN and sapphire composite substrate, laser defocuses on lift-off surface, so the lift-off yield is greatly reduced.

SUMMARY

The present application is to provide a laser lift-off integrated apparatus which can solve the problem of wafer fragmentation caused by defocusing during a laser lift-off process and thus improve the overall manufacturing yield.

Embodiments of the present application provide a laser lift-off integrated apparatus. The laser lift-off integrated apparatus includes a laser light source configured to perform laser lift-off on a wafer to undergo lift-off, a lift-off chamber configured to bear the wafer to undergo lift-off, a heater configured to provide temperature required by the wafer to undergo lift-off during a lift-off process, a profile measuring device configured to acquire surface profile information of the wafer to undergo lift-off and a movable device configured to, according to the surface profile information acquired by the profile measuring device, adjust height of the wafer to undergo lift-off such that a focus of the laser light source is at a position where the wafer to undergo lift-off is to undergo lift-off.

Figure 1:
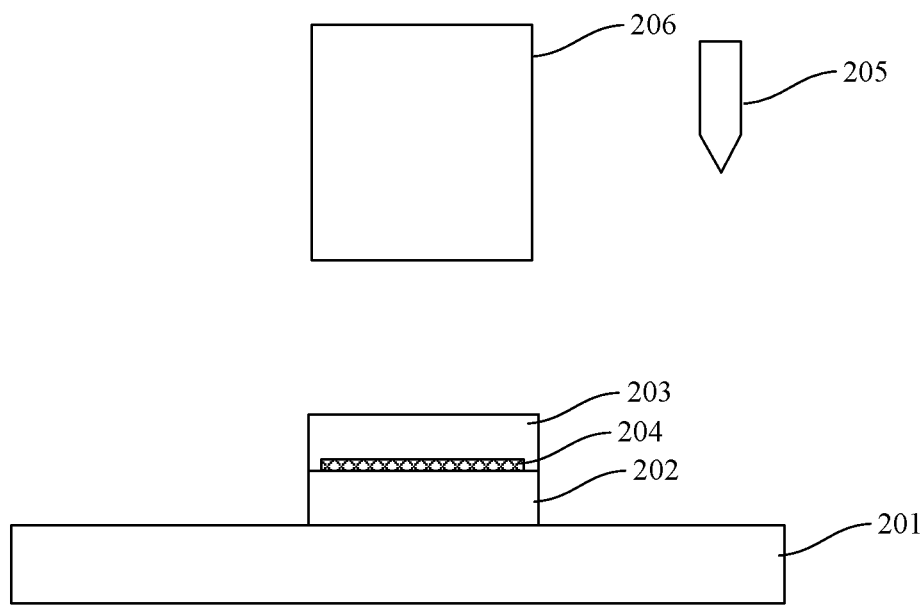
FIGS. 1 and 2 are diagrams illustrating the structure of a laser lift-off integrated apparatus according to embodiment one of the present application.

REFERENCE LIST 201 movable device
202 heater
203 lift-off chamber
204 wafer to undergo lift-off
205 laser light source
206 profile measuring device
207 reflector

DETAILED DESCRIPTION

When embodiments of the present application are described in detail, for ease of description, a section view illustrating a device structure is not partially enlarged according to the general scale, and the diagram is only an example and is not intended to limit the scope of the present application. In addition, actual manufacturing includes three-dimension spatial sizes: length, width and height.

For convenience of description, spatial relation words such as "under", "below", "lower", "underneath", "over" and "above" may be used to describe the relationship between an element or a feature in the drawings and other elements and features in the drawings. It is to be understood that those spatial relation words are intended to include the other directions of the device used or operated except for the directions described in the drawings. In addition, when one layer is described "between" two layers, it can be construed as the only layer between the two layers or one or more layers between the two layers.

In the context of the present application, the described structure where a first feature is "over" a second feature can include an embodiment where the first feature and the second feature are formed into direct contact or an embodiment where other features are formed between the first feature and the second feature and the first feature and the second feature may not be in direct contact.

It is to be noted that the figures provided by the embodiments below merely illustrate the basic conception of the present application in a schematic manner. The figures merely show the components related to the present application, rather than the number, shape and size of components in the actual implementation. In the actual implementation, the type, number and proportion of each component can be changed arbitrarily, and the layout of the components may be more complicated.

Due to large warpage of GaN and sapphire composite substrate, laser defocuses on lift-off surface, so the lift-off yield is greatly reduced. For example, a radius of curvature of a 4-inch GaN and sapphire composite substrate is 0.6-1.5 meters and a corresponding wafer bow is 1200-1300 micrometers. However, the focal depth of the laser is usually about 300 micrometers and a laser focus is not adjustable during a lift-off process. The wafer bow is larger than the focal depth of a light source. More seriously, the wafer bow keeps changing with the lift-off process, which is easy to result in the insufficient or excessive intensity of the laser energy so that undesirable phenomena such as incomplete lift-off and fragmentation occur and thus the lift-off yield is greatly affected.

Embodiment One

Figure 2:
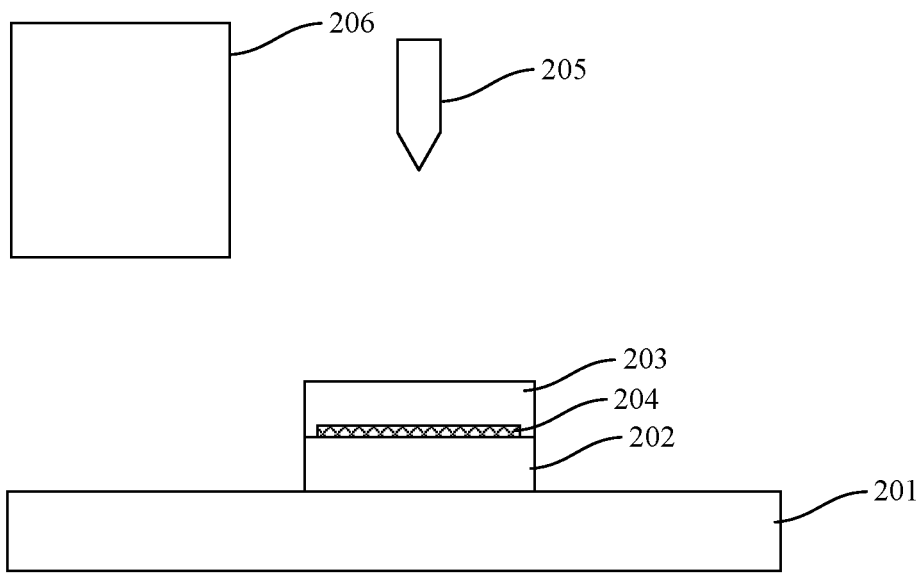

As shown in FIGS. 1 to 2, this embodiment provides a laser lift-off integrated apparatus. The laser lift-off integrated apparatus includes a laser light source 205, a lift-off chamber 203, a heater 202, a profile measuring device 206 and a movable device 201.

As shown in FIG. 1, the laser light source 205 is disposed over the lift-off chamber 203 and is configured to perform laser lift-off on a wafer 204 to undergo lift-off inside the lift-off chamber 203. A wavelength of the laser light source 205 may be 355 nanometers or 266 nanometers. The laser light source 205 is provided with a preset focal depth, such as 250 micrometers to 400 micrometers, during a lift-off process. In this embodiment, the focal depth of the laser light source 205 is 300 micrometers.

The lift-off chamber 203 is configured to bear the wafer 204 to undergo lift-off and provides a sealed environment for the wafer 204 to undergo lift-off. The sealed environment can block the splattering of resultants generated during the lift-off process and, at the same time, provide a suitable process atmosphere for the lift-off. A top of the lift-off chamber 203 is provided with a window for the laser to enter the lift-off chamber 203. The window is positioned directly below the laser light source 205 during the lift-off process. The material of the window may be sapphire and quartz. In this embodiment, quartz is selected to prevent the damage of the laser to the window when the laser passes through the window.

As shown in FIG. 1, the heater 202 is positioned below the lift-off chamber 203 and is configured to provide temperature required by the wafer 204 to undergo lift-off during the lift-off process. For example, the heater 202 may be a resistance wire heater, a radio frequency heater or an infrared tube heater. In this embodiment, the heater 202 is the infrared tube heater.

As shown in FIG. 1, the profile measuring device 206 is configured to acquire surface profile information of the wafer 204 to undergo lift-off. In this embodiment, the profile measuring device 206 is a profilometer which is disposed over the lift-off chamber 203 and indirectly measures a surface profile of the wafer 204 to undergo lift-off. A measurement method used by the profilometer 206 includes one of white light interferometry, Nomarski interferometry or shearing interferometry. In this embodiment, the measurement method of the profilometer 206 uses the white light interferometry which includes one of phase scanning interferometry or a vertical scanning interferometry.

Figure 3A:
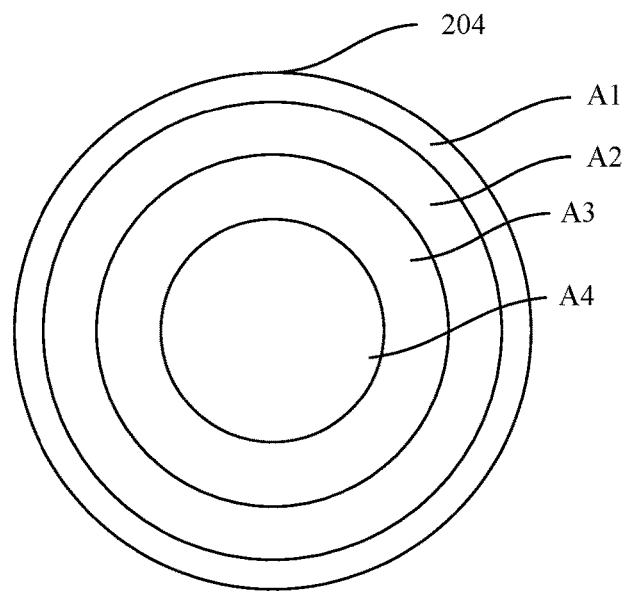
FIGS. 3A and 3B are diagrams illustrating the division of areas to undergo lift-off of a wafer to undergo lift-off according to an embodiment of the present application.
Figure 3B:
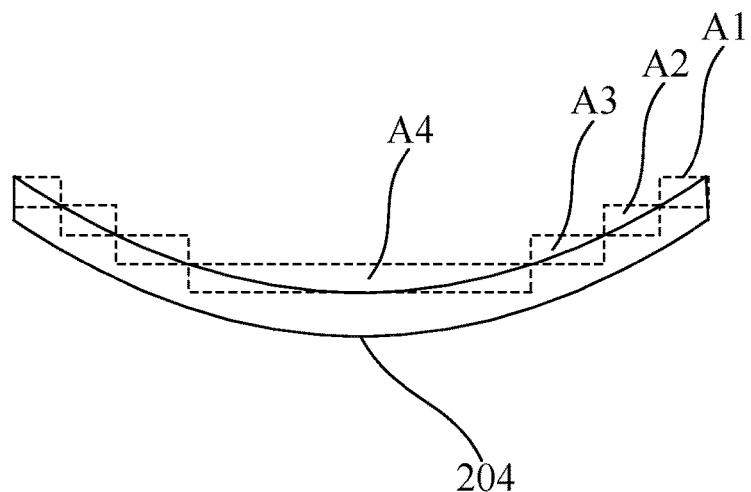

As shown in FIGS. 3A to 3B, the profile measuring device 206, after the surface profile information of the wafer 204 to undergo lift-off is acquired, divides, according to the surface profile information, the surface into a plurality of areas to undergo lift-off. Moreover, the maximum height difference inside each of the plurality of areas to undergo lift-off is less than or equal to the focal depth of the laser light source 205. For example, for a four-inch wafer 204 to undergo lift-off, when an overall profile height difference is 1200 micrometers and the focal depth of the laser light source 205 is 300 micrometers, the wafer 204 to undergo lift-off can be divided into four areas to undergo lift-off which are an area A1 to undergo lift-off, an area A2 to undergo lift-off, an area A3 to undergo lift-off and an area A4 to undergo lift-off, as shown in FIGS. 3A to 3B, so that the maximum height difference inside the each of the plurality of areas to undergo lift-off is less than or equal to the focal depth of the laser light source 205. Optionally, actual number of the areas to undergo lift-off can be set according to the overall profile height difference of the wafer 204 to undergo lift-off and the focal depth of the laser light source 205 and is not limited to the examples illustrated herein.

Due to the release of a part of stresses, a wafer profile may change during a continuous laser lift-off process. To improve the precision of a lift-off position, after the laser lift-off of the each of the plurality of areas to undergo lift-off is completed, the profile measuring device 206 is used to scan and re-divide the remaining area of the wafer 204 to undergo lift-off to form new areas to undergo lift-off.

For different areas to undergo lift-off, the laser light source 205 adjusts, according to a surface profile of the plurality of areas to undergo lift-off, laser parameters which include one or a plurality of scan line speed and duty cycle.

Figure 4:
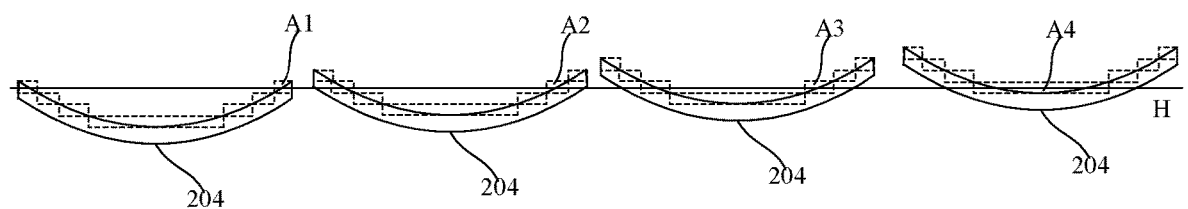
FIG. 4 is a height variation diagram of a wafer to undergo lift-off in different areas to undergo lift-off during a lift-off process according to an embodiment of the present application.

The movable device 201 is configured to, according to the surface profile information acquired by the profile measuring device 206, adjust the height of the wafer 204 to undergo lift-off such that the focus of the laser light source 205 is at a position where the wafer 204 to undergo lift-off is to undergo lift-off during the lift-off process. As shown in FIG. 4, H is a reference plane and the corresponding position is the middle height of the current area to undergo lift-off and is also the middle of the focal depth of the laser. For different lift-off stages, the movable device 201 is used to adjust the height of the wafer 204 to undergo lift-off. Since the laser focus is not adjustable during the lift-off process, the height of the wafer 204 to undergo lift-off is adjusted so that the laser focus can be always positioned at the area to undergo lift-off of the wafer.

In this embodiment, the movable device 201 is also configured to drive the wafer 204 to undergo lift-off to horizontally move. As shown in FIGS. 1 to 2, the movable device 201 can drive the wafer 204 to undergo lift-off to move between the profilometer 206 and the laser light source 205.

This embodiment also provides a lift-off method for the laser lift-off integrated apparatus. The steps are described below.

In step 1, the wafer 204 to undergo lift-off is placed in the lift-off chamber 203. The protective atmosphere is added and the temperature is raised to the lift-off temperature.

In step 2, the movable device 201 is utilized to horizontally move the lift-off chamber 203, the heater 202 and the wafer 204 to undergo lift-off below the profilometer 206. The profilometer 206 is used to measure the surface profile information of the wafer 204 to undergo lift-off and determine, according to the surface profile information, the area A1 to undergo lift-off, the area A2 to undergo lift-off, the area A3 to undergo lift-off and the area A4 to undergo lift-off. See FIG. 1 and FIGS. 3A and 3B.

In step 3, the height of the wafer 204 to undergo lift-off is adjusted by the movable device 201 according to the surface profile information.

In step 4, the movable device 201 is utilized to horizontally move the lift-off chamber 203, the heater 202 and the wafer 204 to undergo lift-off below the laser light source 205. See FIG. 2. The laser is used to scan the area A1 to undergo lift-off of the wafer 204 to undergo lift-off.

In step 5, the laser scanning is stopped and step 2 through step 4 is repeated to perform lift-off on the area A2 to undergo lift-off, the area A3 to undergo lift-off, the area A4 to undergo lift-off A4 or more areas to undergo lift-off.

In step 6, the laser lift-off is completed. After the temperature is lowered, the wafer is taken out.

Embodiment Two

Figure 5:
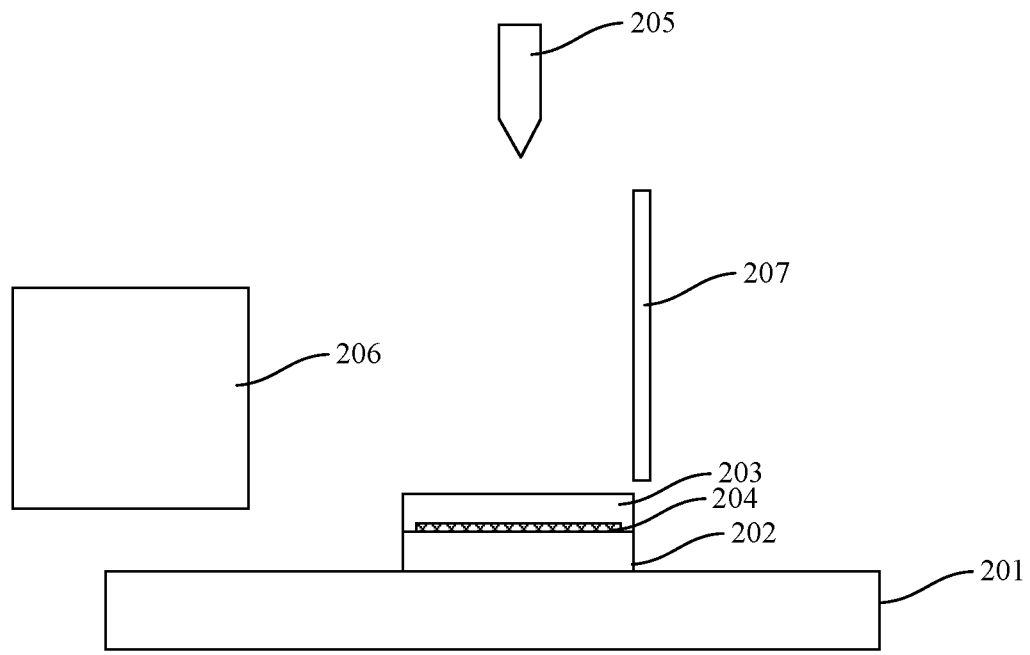
FIGS. 5 and 6 are diagrams illustrating the structure of a laser lift-off integrated apparatus according to embodiment two of the present application.
Figure 6:
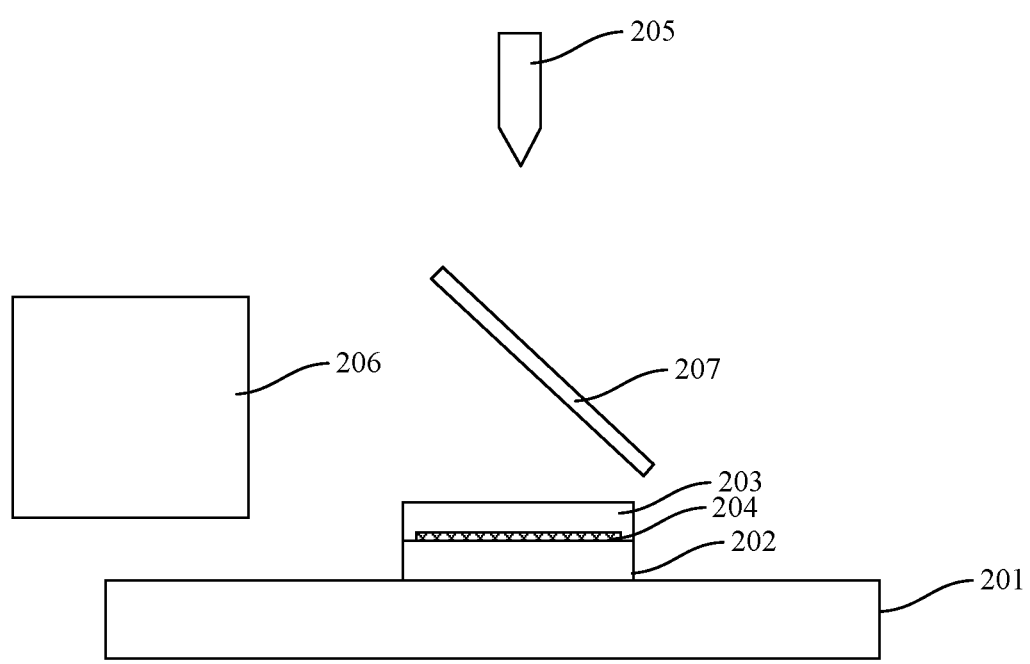

As shown in FIGS. 5 to 6, this embodiment provides a laser lift-off integrated apparatus, the basic structure of which is the same as the basic structure of the embodiment one. The laser lift-off integrated apparatus includes a laser light source 205, a lift-off chamber 203, a heater 202, a profile measuring device 206 (namely a profilometer), a movable device 201 and a reflector 207. The profile measuring device 206 and the reflector 207 are positioned over a wafer 204 to undergo lift-off and are positioned on two sides of the wafer 204 to undergo lift-off. The profile measuring device 206 directly faces the reflector 207 which reflects and images the wafer 204 to undergo lift-off into the profile measuring device 206 through tilting rotation. The reflector 207 rotates in a plane shown in FIG. 5. The movable device 201 is merely configured to, according to surface profile information acquired by the profile measuring device 206, adjust the height of the wafer 204 to undergo lift-off such that a focus of the laser light source 205 is at a position where the wafer 204 to undergo lift-off is to undergo lift-off during a lift-off process and does not need a horizontal movement function. In this manner, the apparatus can be simplified and a lift-off position offset caused by a moving error can be avoided. Thus, the lift-off yield can be improved.

This embodiment also provides a lift-off method for the laser lift-off integrated apparatus. The steps are described below.

In step 1, the wafer 204 to undergo lift-off is placed in the lift-off chamber 203. The protective atmosphere is added and the temperature is raised to the lift-off temperature.

In step 2, the reflector 207 is rotated such that the reflector 207 is angled at 45 degrees to the horizontal plane. The profilometer 206 directly faces the tilted reflector 207, measures surface profile information of an area to undergo lift-off of the wafer positioned below the reflector 207 through the reflection image of the reflector 207. See FIG. 6. According to the surface profile information, an area A1 to undergo lift-off, an area A2 to undergo lift-off, an area A3 to undergo lift-off and an area A4 to undergo lift-off are determined. See FIG. 1 and FIGS. 3A and 3B.

In step 3, the height of the wafer 204 to undergo lift-off is adjusted by the movable device 201 according to the surface profile information.

In step 4, the reflector 207 is rotated such that the reflector 207 is perpendicular to the horizontal plane without blocking the laser. See FIG. 5. The laser is used to scan the area A1 to undergo lift-off of the wafer 204 to undergo lift-off.

In step 5, the laser scanning is stopped and step 2 through step 4 is repeated to perform lift-off on the area A2 to undergo lift-off, the area A3 to undergo lift-off, the area A4 to undergo lift-off or more areas to undergo lift-off.

In step 6, the laser lift-off is completed. After the temperature is lowered, the wafer is taken out.

The movable device 201 in this embodiment is merely configured to, according to the surface profile information acquired by the profile measuring device 206, adjust the height of the wafer 204 to undergo lift-off such that the focus of the laser light source 205 is at the position where the wafer 204 to undergo lift-off is to under lift off during the lift-off process and does not need the horizontal movement function. In this manner, the apparatus can be simplified and the lift-off position offset caused by the moving error can be avoided. Thus, the lift-off yield can be improved.

Embodiment Three

This embodiment provides a laser lift-off integrated apparatus, the basic structure of which is the same as the basic structure of the embodiment one. What is different from the embodiment one is that the profile measuring device 206 is a laser rangefinder. The laser rangefinder 206 obtains single-point data in one measurement and utilizes the movable device 201 with functions of horizontal rotation and horizontal movement to obtain surface profile information through multi-point measurement and fitting data.

This embodiment also provides a lift-off method for the laser lift-off integrated apparatus. The steps are described below:

In step 1, a wafer 204 to undergo lift-off is placed in a lift-off chamber 203. The protective atmosphere is added and the temperature is raised to the lift-off temperature.

In step 2, a movable device 201 is utilized to horizontally move the lift-off chamber 203, a heater 202 and the wafer 204 to undergo lift-off below the laser rangefinder. The laser rangefinder is used to measure surface profile information of the wafer 204 to undergo lift-off and determine, according to the surface profile information, an area A1 to undergo lift-off, an area A2 to undergo lift-off, an area A3 to undergo lift-off and an A4 area to undergo lift-off A4. See FIG. 1 and FIGS. 3A and 3B.

In step 3, the height of the wafer 204 to undergo lift-off is adjusted by the movable device 201 according to the surface profile information.

In step 4, the movable device 201 is utilized to horizontally move the lift-off chamber 203, the heater 2 and the wafer 204 to undergo lift-off below a laser light source 205. See FIG. 2. The laser is used to scan the area A1 to undergo lift-off of the wafer 204 to undergo lift-off.

In step 5, the laser scanning is stopped and step 2 through step 4 is repeated to perform lift-off on the area A2 to undergo lift-off, the area A3 to undergo lift-off, the A4 area to undergo lift-off or more areas to undergo lift-off.

In step 6, the laser lift-off is completed. After the temperature is lowered, the wafer is taken out.

As described above, the laser lift-off integrated apparatus in the present application has the beneficial effects below.

The present application provides a laser lift-off integrated apparatus and the using method. Surface profile information of a wafer 204 to undergo lift-off is measured in real time and the height of the wafer is adjusted in real time during a lift-off process, which can ensure a laser focus is at a position where the wafer to undergo lift-off is to undergo lift-off in the lift-off process so that laser cannot defocus on the lift-off surface and thus the laser lift-off yield can be improved.

What is claimed is:

1. A laser lift-off integrated apparatus, comprising:
   a laser light source configured to perform laser lift-off on a wafer to undergo lift-off;
   a lift-off chamber configured to bear the wafer to undergo lift-off;
   a heater configured to provide temperature required by the wafer to undergo lift-off during a lift-off process;
   a profile measuring device configured to acquire surface profile information of the wafer to undergo lift-off; and
   a movable device configured to adjust, according to the surface profile information acquired by the profile measuring device, a height of the wafer to undergo lift-off such that a focus of the laser light source is at a position where the wafer to undergo lift-off is to undergo lift-off,
   wherein the profile measuring device is further configured to, after the surface profile information of the wafer to undergo lift-off is acquired, divide, according to the surface profile information, a surface of the wafer to undergo lift-off into a plurality of areas to undergo lift-off, and
   wherein a number of the plurality of areas to undergo lift-off is set according to an overall profile height difference of the wafer to undergo lift-off and a focal depth of the laser light source; and a maximum height difference inside each of the plurality of areas to undergo lift-off is less than or equal to the focal depth of the laser light source.

2. The laser lift-off integrated apparatus according to claim 1, wherein the profile measuring device comprises one of a profilometer or a laser rangefinder.

3. The laser lift-off integrated apparatus according to claim 2, wherein the profile measuring device is a profilometer, wherein the profilometer is configured to indirectly measure a surface profile of the wafer to undergo lift-off, and a measurement method used by the profilometer comprises one of white light interferometry, Nomarski interferometry or shearing interferometry.

4. The laser lift-off integrated apparatus according to claim 3, wherein the measurement method of the profilometer is the whiter light interferometry, wherein the whiter light interferometry comprises one of phase scanning interferometry or vertical scanning interferometry.

5. The laser lift-off integrated apparatus according to claim 1, wherein the profile measuring device is further configured to, after laser lift-off of the each of the plurality of areas to undergo lift-off is completed, scan and re-divide a remaining area of the wafer to undergo lift-off to form new areas to undergo lift-off.

6. The laser lift-off integrated apparatus according to claim 1, wherein the laser light source is able to adjust laser parameters according to a surface profile of the plurality of areas to undergo lift-off, wherein the laser parameters comprise at least one of a scan line speed or a duty cycle.

7. The laser lift-off integrated apparatus according to claim 1, wherein the movable device is further configured to drive the wafer to undergo lift-off to perform at least one of horizontal movement or horizontal rotation.

8. The laser lift-off integrated apparatus according to claim 1, further comprising a reflector, wherein the profile measuring device and the reflector are positioned over the wafer to undergo lift-off and on two sides of the wafer to undergo lift-off, the profile measuring device faces the reflector, and the reflector is configured to reflect and image the wafer to undergo lift-off into the profile measuring device through tilting rotation.

9. The laser lift-off integrated apparatus according to claim 1, wherein a wavelength of the laser light source is 355 nanometers or 266 nanometers.

* * * * *